(12) United States Patent
Kim et al.

(10) Patent No.: US 9,341,764 B2
(45) Date of Patent: May 17, 2016

(54) BACKLIGHT UNIT AND LIQUID CRYSTAL DISPLAY COMPRISING THE SAME

(71) Applicant: Samsung Display Co., Ltd., Yongin, Gyeonggi-Do (KR)

(72) Inventors: Rae Young Kim, Hwaseong-si (KR); Myoung Seok Son, Yongin-si (KR); Taek Sun Shin, Hwaseong-si (KR); Sun Hee Oh, Anyang-si (KR); Kwang Wook Choi, Osan-si (KR)

(73) Assignee: Samsung Display Co., Ltd. (KR)

( * ) Notice: Subject to any disclaimer, the term of this patent is extended or adjusted under 35 U.S.C. 154(b) by 76 days.

(21) Appl. No.: 14/478,883

(22) Filed: Sep. 5, 2014

(65) Prior Publication Data

US 2015/0289367 A1     Oct. 8, 2015

(30) Foreign Application Priority Data

Apr. 3, 2014  (KR) .................. 10-2014-0040071

(51) Int. Cl.
| | | |
|---|---|---|
| *H01L 23/48* | (2006.01) | |
| *F21V 8/00* | (2006.01) | |
| *H05K 1/18* | (2006.01) | |

(52) U.S. Cl.
CPC ............ *G02B 6/0065* (2013.01); *G02B 6/0083* (2013.01); *H05K 1/181* (2013.01); *H05K 2201/10106* (2013.01); *H05K 2201/10136* (2013.01); *H05K 2201/10204* (2013.01); *H05K 2201/10454* (2013.01)

(58) Field of Classification Search
CPC .................. H05K 1/181; H05K 2201/10204; H05K 2201/10454; G02B 6/0065; G02B 6/0083
USPC ........................................... 349/65
See application file for complete search history.

(56) References Cited

U.S. PATENT DOCUMENTS

| | | | | |
|---|---|---|---|---|
| 5,912,654 | A | * 6/1999 | Ouchi | .................. H05K 1/0271 345/98 |
| 6,774,968 | B2 | * 8/2004 | Hagiwara | ............. G02F 1/1345 349/139 |
| 2010/0103637 | A1 | 4/2010 | Jin et al. | |
| 2011/0032687 | A1 | 2/2011 | Song | |

FOREIGN PATENT DOCUMENTS

| | | |
|---|---|---|
| KR | 10-2007-0102238 | 10/2007 |
| KR | 10-2009-0128693 | 12/2009 |
| KR | 10-2010-0122199 | 11/2010 |
| KR | 10-2011-0068517 | 6/2011 |

* cited by examiner

*Primary Examiner* — Tracie Y Green
(74) *Attorney, Agent, or Firm* — Innovation Counsel LLP

(57) ABSTRACT

Provided are a backlight unit and a liquid crystal display including the backlight unit. The backlight unit includes a light emitting package, and a light guide plate disposed at one side of the light emitting package. The light emitting package includes a printed circuit board including first regions that are spaced an interval apart from each other and second regions defined between the first regions, light source units disposed on the first regions of the printed circuit board, dummy wiring patterns disposed on the second regions of the printed circuit board, and wiring patterns disposed on the printed circuit board and electrically connected to the light source units.

20 Claims, 16 Drawing Sheets

BACKLIGHT UNIT AND LIQUID CRYSTAL DISPLAY COMPRISING THE SAME

CROSS-REFERENCE TO RELATED APPLICATION

This application claims priority from Korean Patent Application No. 10-2014-0040071 filed on Apr. 3, 2014 in the Korean Intellectual Property Office, the disclosure of which is incorporated herein by reference in its entirety.

BACKGROUND

1. Field of Art

The present application relates to a backlight unit and a liquid crystal display comprising the same, and more particularly, to an edge-type backlight unit and a liquid crystal display comprising the edge-type backlight unit.

2. Description of the Related Art

In general, a liquid crystal display (LCD) includes an LCD module connected to an external case. The LCD includes an LCD module having two sheets of substrates with a liquid crystal layer disposed therebetween, and a backlight unit positioned in the rear of the LCD module that supplies light to the liquid crystal layer. The LCD module displays an image by controlling the transmittance of light supplied from the backlight unit.

The backlight unit may be classified as either direct-type or edge-type according to the position of a light source. In a direct-type backlight unit, a light source is provided behind the liquid crystal layer of a display panel. In an edge-type backlight unit, a light source is provided near one or more edges of a display panel.

The edge-type backlight unit generally requires a light guide plate that guides the light emitted from the light source to the display panel. The light guide plate guides the light to the display panel by changing an optical path.

SUMMARY

The present application discloses a backlight unit having improved adhesion performance between a printed circuit board and a light guide plate.

The present application also discloses an LCD having improved adhesion performance between a printed circuit board and a light guide plate.

The present application also discloses a backlight unit that suppresses light leakage.

The present application also discloses an LCD that suppresses light leakage.

The above and other objects of the present application are described herein and/or would be apparent to those of ordinary skill in the art reading the following description of the various embodiments.

According to one embodiment, there is provided a backlight unit including a light emitting package, and a light guide plate disposed at one side of the light emitting package, wherein the light emitting package includes a printed circuit board including first regions that are spaced an interval apart from each other and second regions defined between the first regions, light source units disposed on the first regions of the printed circuit board, dummy wiring patterns disposed on the second regions of the printed circuit board, and wiring patterns disposed on the printed circuit board and electrically connected to the light source units.

According to another embodiment, there is provided an LCD including a backlight unit, and a display panel disposed on the backlight unit, wherein the backlight unit includes a light emitting package, and a light guide plate disposed at one side of the light emitting package, the light emitting package comprising a printed circuit board including first regions that are spaced an interval apart from each other and second regions defined between the first regions, light source units disposed on the first regions of the printed circuit board, dummy wiring patterns disposed on the second regions of the printed circuit board, and wiring patterns disposed on the printed circuit board and electrically connected to the light source units.

The embodiments disclosed in the present application provide advantages over prior backlight display units. Advantages include improving adhesion performance between a printed circuit board and a light guide plate and suppressing light leakage that typically occurs between a printed circuit board and a light guide plate.

BRIEF DESCRIPTION OF THE DRAWINGS

The accompanying drawings, which are included as part of the present application, illustrate various embodiments and together with the description of the various embodiments given below serve to explain and teach the principles described herein. The figures in the drawings are not necessarily drawn to scale and are only intended to facilitate the description of the various embodiments described herein. The figures do not describe every aspect of the teachings disclosed herein and do not limit the scope of the claims.

DETAILED DESCRIPTION

Figure 1:
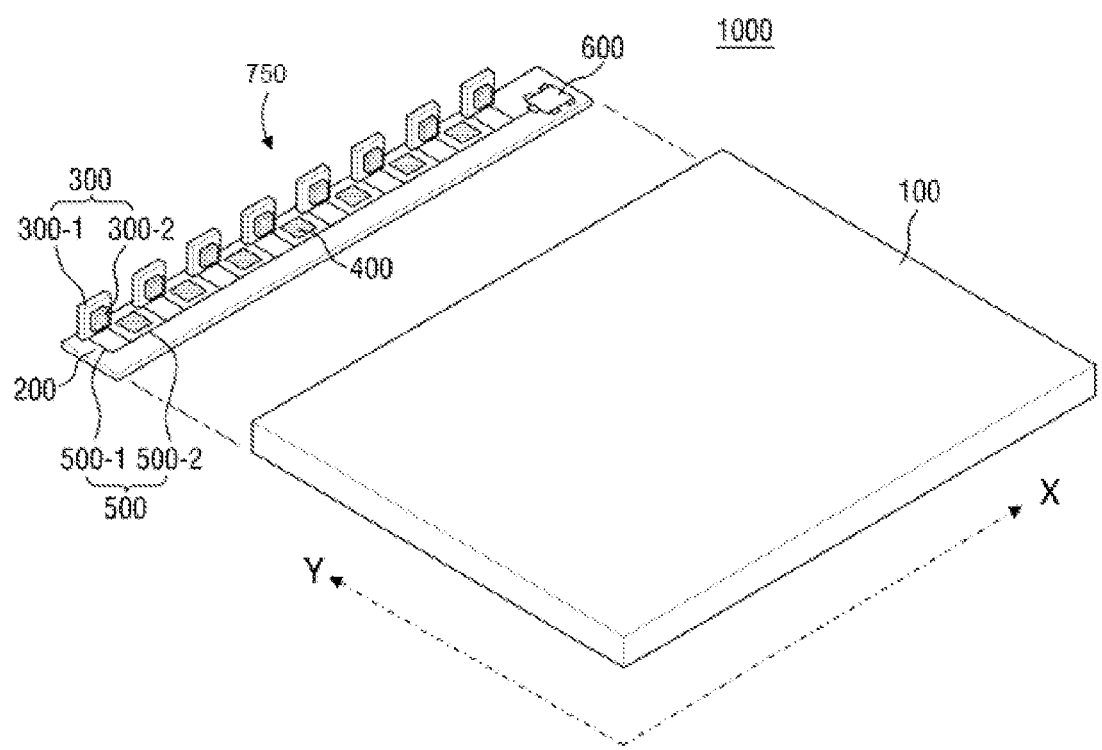
FIG. 1 is a perspective view of a backlight unit according to an embodiment of the present system and method.

The aspects and features of the present system and method for achieving the aspects and features are apparent by referring to the embodiments described herein with reference to the accompanying drawings. However, the present system and method are not limited to the embodiments disclosed herein and can be implemented in diverse forms. The matters defined in the description, such as the detailed construction and elements, are provided exemplarily to assist those of ordinary skill in the art in understanding the present system and method.

The term "on" that is used to designate that an element is on another element or located on a different layer includes both a case where an element is located directly on another element or a layer and a case where an element is located on another element via another layer or still another element. In the present application, the same drawing reference numerals are used for the same elements across various figures.

Although the terms "first," "second," and so forth are used to describe diverse constituent elements, such constituent elements are not limited by the terms. The terms serve to distinguish a constituent element from other constituent elements.

Hereinafter, embodiments of the present system and method are described with reference to the attached drawings.

Figure 2:
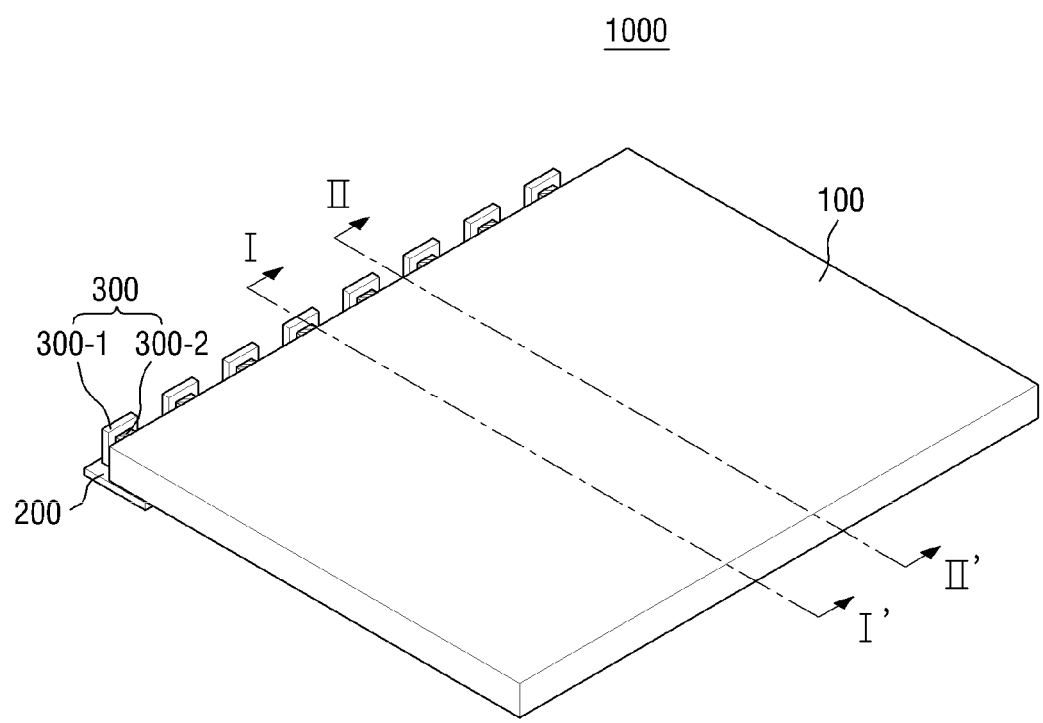
FIG. 2 is an assembled perspective view of the backlight unit shown in FIG. 1.
Figure 3:
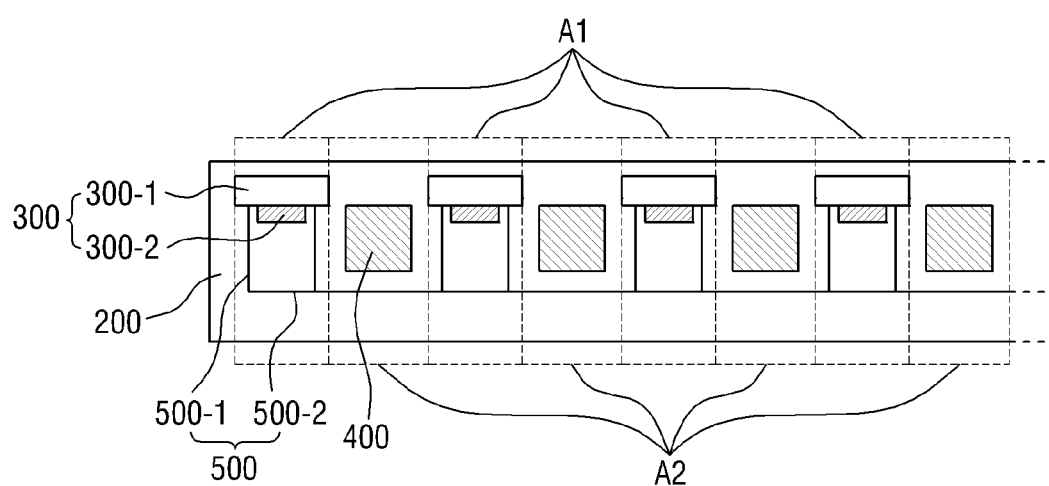
FIG. 3 is a partial, plan view of the backlight unit shown in FIG. 1.

FIG. 1 is a perspective view of a backlight unit according to an embodiment of the present system and method, FIG. 2 is an assembled perspective view of the backlight unit shown in FIG. 1, and FIG. 3 is a partial, plan view of the backlight unit shown in FIG. 1.

Referring to FIGS. 1 to 3, the backlight unit 1000 includes a light emitting package and a light guide plate 100 disposed at one side of the light emitting package. The light emitting package includes a printed circuit board 200 that has first regions A1 spaced an interval apart from each other and second regions A2 defined between the first regions A1. Light source units 300 are disposed on the first regions A1 and dummy wiring patterns 400 are disposed on the second regions A2. Wiring patterns 500 are disposed on the printed circuit board 200 and electrically connected to the light source units 300.

FIG. 3 shows exemplarily how the printed circuit board 200 may be divided into regions on which the light source units 300, the wiring patterns 500 and the dummy wiring patterns 400 are positioned. FIG. 1 illustrates that the printed circuit board 200 may extend in one direction and have a rectangular shape such that the longer sides extend in parallel with an x-axis and the shorter sides extend in parallel with a y-axis.

In an exemplary embodiment, the printed circuit board 200 may be a flexible printed circuit board such that it may be bendable or foldable. The flexibility of the printed circuit board 200 may be attributed to the material composition or the thickness of the printed circuit board 200. For example, the printed circuit board 200 may be created on a thin film by employing a chip-on-film (COF) method in which various types of chips are mounted on a thin film.

FIG. 3 illustrates exemplarily how the first regions A1 and the second regions A2 may be defined on the printed circuit board 200. Each of the first regions A1 may include an area where a light source unit 300 is disposed and a peripheral area that surrounds the light source unit 300. The first regions A1 are spaced an interval apart from each other and are arranged in parallel with the x-axis. The second regions A2 may be defined between the first regions A1. In other words, the first regions A1 and the second regions A2 may be alternately arranged on the printed circuit board 200.

The light source units 300 may be arranged on the first regions A1 and supply light to a display panel (not shown) via the light guide plate 100. As FIG. 1 illustrates, each of the light source units 300 may include a body part 300-1 and a light emitting part 300-2 that protrudes from the body part 300-1.

In an exemplary embodiment, the body part 300-1 may protrude vertically from a top surface of the printed circuit board 200. The body part 300-1 may be integrally formed with the printed circuit board 200, but aspects of the present system and method are not limited thereto. The body part 3001 may be separately formed and then coupled to the printed circuit board 200. The body part 300-1 may be coupled to the printed circuit board 200 by, for example, a forced fitting method. The present system and method are not limited to the coupling method of the body part 300-1 discussed herein.

According to one embodiment, the body part 300-1 may have the shape of a rectangular parallelepiped. According to another embodiment, the body part 300-1 may be circular or have a shape that includes at least a partially curved portion. The body part 300-1 may be formed using the same material as the printed circuit board 200, e.g., a plastic or a metal.

FIGS. 1 to 3 illustrate that a plurality of body parts 300-1 may be disposed on the printed circuit board 200. The plurality of body parts 300-1 may be spaced apart from each other and may be aligned in one direction, e.g., along the longer sides of the printed circuit board 200 and in parallel with the x-axis.

The light emitting part 300-2 may be disposed on the body part 300-1. The light emitting part 300-2 is a component of each of the light source units 300 and configured to emit light to the light guide plate 100, which scatters and reflects the light to the display panel (not shown).

The light emitting part 300-2 may include, but is not limited to, one or more selected from the group consisting of a light emitting diode (LED), a cold cathode fluorescent lamp (CCFL) and an organic light emitting diode. The present system and method do not limit the kind of the light emitting part 300-2 to those listed herein.

In an exemplary embodiment, the light emitting part 300-2 may protrude from the body part 300-1 by a distance. FIG. 1 illustrates that the light emitting part 300-2 is disposed on a sidewall of the body part 300-1 and protrudes from the sidewall of the body part 300-1. However, it is also contemplated that the light emitting part 300-2 may be disposed on the body part 300-1 without protruding therefrom (e.g., embedded in body part 300-1). The light emitting part 300-2 may be disposed to face and irradiate light toward the light guide plate 100. The light emitted from the light emitting part 300-2 is transmitted to the light guide plate 100, which scatters and reflects the light to the display panel (not shown).

The light emitting part 300-2 may include a plurality of light emitting parts. Although FIGS. 1 and 2 illustrate a case in which one light emitting part 300-2 is disposed in one body part 300-1, one or more light emitting parts 300-2 may be disposed in one body part 300-1.

FIGS. 1 and 3 illustrate that a plurality of wiring patterns 500 may be disposed on the printed circuit board 200. The wiring patterns 500 may be electrically connected to the light source units 300 and supply power to drive the light source units 300. The wiring patterns 500 may be made of a conductive material, such as copper. A conductive material includes any material that those of ordinary skill in the art would consider to be a suitable electrical conductor (e.g., resistivity~$10^{-8}$ $\Omega \cdot m$ or less) for driving the light source units 300.

FIGS. 1 and 3 illustrate that the wiring patterns 500 may include a first line wiring pattern 500-1 and a second line wiring pattern 500-2. The first line wiring pattern 500-1 may extend in parallel with the y-axis and may have one end make electrical contact with the light source unit 300. The second line wiring pattern 500-2 may extend in parallel with the x-axis and be in electrical contact with the first line wiring pattern 500-1 and a connector 600. That is to say, the first line wiring pattern 500-1 and the second line wiring pattern 500-2 may be electrically connected to each other and a bent portion may be formed at a contact point of the first line wiring pattern 500-1 and the second line wiring pattern 500-2.

FIGS. 1 and 2 illustrate a case in which two first line wiring patterns 500-1 are connected to each light source unit 300, and one second line wiring pattern 500-1 is connected to the first line wiring patterns 500-1 extending from the plurality of light source units 300. The present application contemplates any number and shape of the first line wiring pattern 500-1 and the second line wiring pattern 500-2 and not just those discussed herein. That is to say, one or more first line wiring patterns 500-1 may be connected to the light source units 300, and one or more second line wiring patterns 500-2 may connect the first line wiring patterns 500-1 to the connector 600, depending on the method used to electrically drive the light source units 300.

The connector 600, although it may be located elsewhere on the printed circuit board, is shown in FIGS. 1 and 3 to be formed at one end of the printed circuit board 200. The connector 600 serves as a point of electrical contact between the light source units 300 and a driver (not shown) for transmitting power and/or signals that are required to drive the light source units 300. The connector 600 is electrically connected to at least one second line wiring pattern 500-2 and is generally made of an electrically conductive material.

As FIG. 3 illustrates, the dummy wiring patterns 400 are disposed on the second regions A2, that is, on regions between two adjacent light source units 300 as well as between the first line wiring patterns 500-1 of adjacent light source units 300.

According to an embodiment, the dummy wiring patterns 400 protrude from the printed circuit board 200 by a distance. The protruding thicknesses of the dummy wiring patterns 400 may be equal or substantially equal to those of the wiring patterns 500. Protruding dummy wiring patterns of the same or similar thickness help to compensate for a step difference caused by the thickness of the wiring patterns 500.

In an exemplary embodiment, the dummy wiring patterns 400 may be made of a conductive material, such as copper. The dummy wiring patterns 400 and the wiring patterns 500 may be formed using the same or substantially the same material. The dummy wiring patterns 400 may be physically separated and/or electrically insulated from the wiring patterns 500.

FIGS. 1 and 2 illustrate that the light guide plate 100 may be disposed at one side of the light emitting package 750. In other words, the backlight unit 1000 of the embodiment shown in FIG. 1 is an edge-type backlight unit.

The light guide plate 100 supplies the light transmitted from the light emitting package 750 to the display panel (not shown). The light guide plate 100 may be made of a transparent material, including, but not limited to, polycarbonate (PC), polymethyl methacrylate (PMMA), or the like. In some embodiments, the light guide plate 100 may be flexible due to its thickness, shape or material of composition.

Although not shown in the figures, one or more scattering patterns may be formed on a bottom surface of the light guide plate 100 to help scatter and reflect light from the light emitting package 750 to the display panel (also not shown).

A method for coupling the light guide plate 100 and the light emitting package 750 is described with reference to FIG. 4, a cross-sectional view taken along the line I-I' of FIG. 2.

Figure 4:
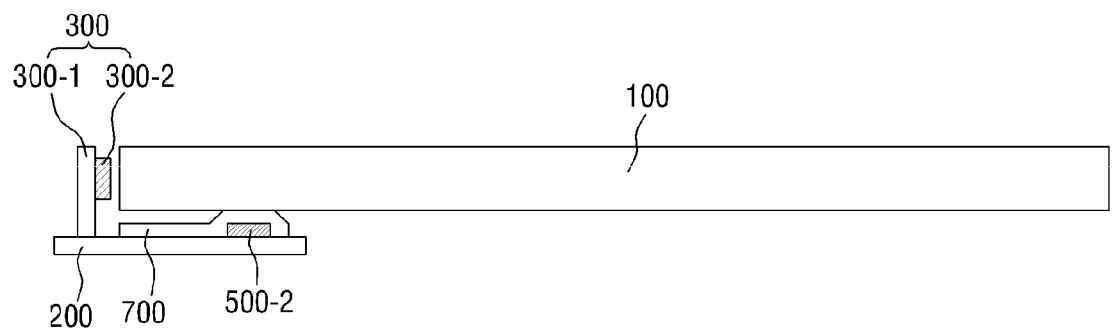
FIG. 4 is a cross-sectional view taken along the line I-I' of FIG. 2.

According to the embodiment shown in FIG. 4, one side surface of the light guide plate 100 may face the light source units 300 of the printed circuit board 200 and a portion of the bottom surface of the light guide plate 100 may face a portion of the top surface of the printed circuit board 200.

An adhesive layer 700 may be interposed between the light guide plate 100 and the printed circuit board 200 to couple/combine the light guide plate 100 and the printed circuit board 200. The adhesive layer 700 may include, but is not limited to, an adhesive sheet or an adhesive. The adhesive layer 700 may be formed by coating or printing, but is not limited thereto. In an exemplary embodiment, the adhesive layer 700 may include an optically clear adhesive (OCA) or an optically clear resin, but is not limited thereto. The present application contemplates that various kinds of adhesives may be used to form the adhesive layer 700.

The adhesive layer 700 may overlap with the dummy wiring patterns 400 and the wiring patterns 500. For example, the adhesive layer 700 may cover at least portions of the dummy wiring patterns 400 or may overlap completely with the dummy wiring patterns 400.

Figure 5:
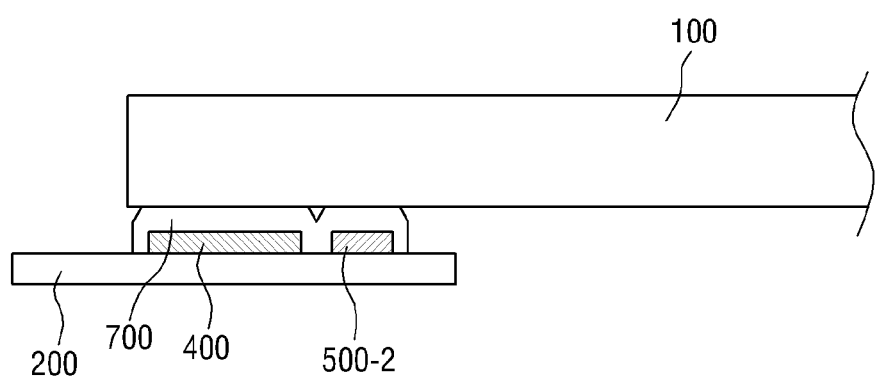
FIG. 5 is a cross-sectional view taken along the line II-II' of FIG. 2.

Referring to FIG. 5, a cross-sectional view taken along the line II-II' of FIG. 2, the adhesive layer 700 may be interposed between the printed circuit board 200 and the light guide plate 100 and may cover the wiring patterns 500 and the dummy wiring patterns 400 of the printed circuit board 200.

The following discussion illustrates an advantage of implementing dummy wiring patterns 400. As described above, the wiring patterns 500 and the dummy wiring patterns 400 may protrude from the printed circuit board 200 by a distance and generate a step difference. Due to the step difference, only portions of a top surface of the adhesive layer 700—regions of the adhesive layer 700 overlapping with the wiring patterns 500 and the dummy wiring patterns 400—may make contact with the bottom surface of the light guide plate 100. The other regions of the adhesive layer 700 that do not overlap with the wiring patterns 500 and the dummy wiring patterns 400 may be spaced a distance apart from the bottom surface of the light guide plate 100.

In other words, when only the wiring patterns 500 exist without the dummy wiring patterns 400, the contact area between the light guide plate 100 and the adhesive layer 700 is small, which lowers adhesion performance between the light guide plate 100 and the adhesive layer 700. However, when the dummy wiring patterns 400 having the same thickness as the wiring patterns 500 are disposed, the contact area between the light guide plate 100 and the adhesive layer 700 is increased, thereby increasing the adhesive force between the light guide plate 100 and the printed circuit board 200.

Figure 6:
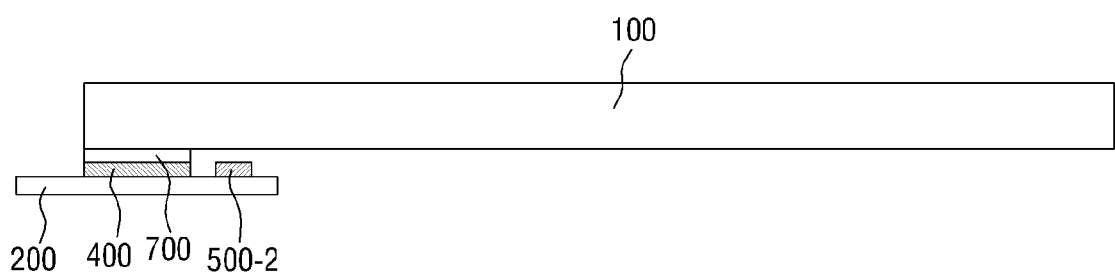
FIG. 6 is a cross-sectional view illustrating a modified example of the backlight unit shown in FIG. 5, according to another embodiment.

Hereinafter, other embodiments of the present system and method are described. In the following embodiments, the same components as those described above are denoted by the same reference numerals, and repeated descriptions thereof are omitted or briefly made. FIG. 6 is a cross-sectional view illustrating a modified example of the backlight unit shown in FIG. 5, according to another embodiment. Unlike the embodiment shown in FIG. 5, the adhesive layer 700 in FIG. 6 overlaps with only the dummy wiring patterns 400 and not with the wiring patterns 500. Because the adhesive layer 700 overlaps only with the dummy wiring patterns 400, the wiring patterns 500 are spaced a distance apart from a bottom surface of the light guide plate 100, which may be ascribed to a step difference generated by the adhesive layer 700.

FIG. 6 illustrates that an adhesive layer 700 may have the same shape and/or size as the dummy wiring patterns 400. For example, both the adhesive layer 700 and the dummy wiring patterns 400 may have the same or substantially the same rectangular shape. The present system and method, however, are not limited to the shape of the dummy wiring patterns 400 and/or the adhesive layer 700 described herein.

Figure 7:
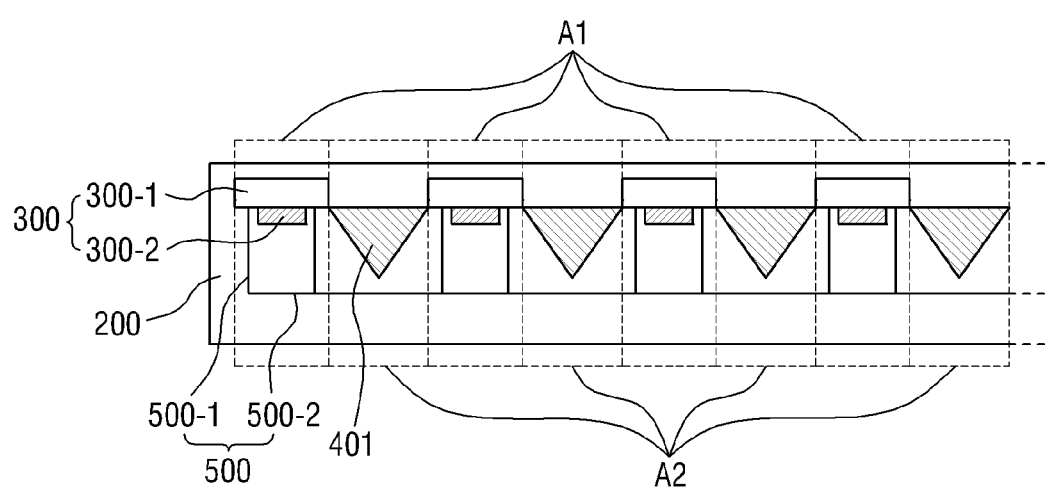
FIG. 7 is a partial, plan view of a backlight unit according to another embodiment.
Figure 8:
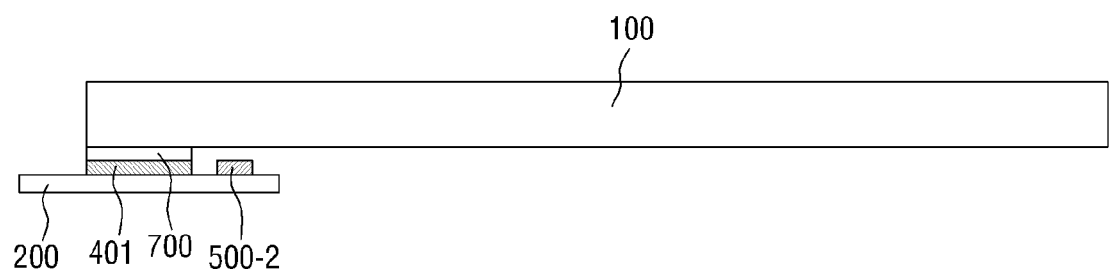
FIG. 8 is a cross-sectional view of the backlight unit shown in FIG. 7.
Figure 9:
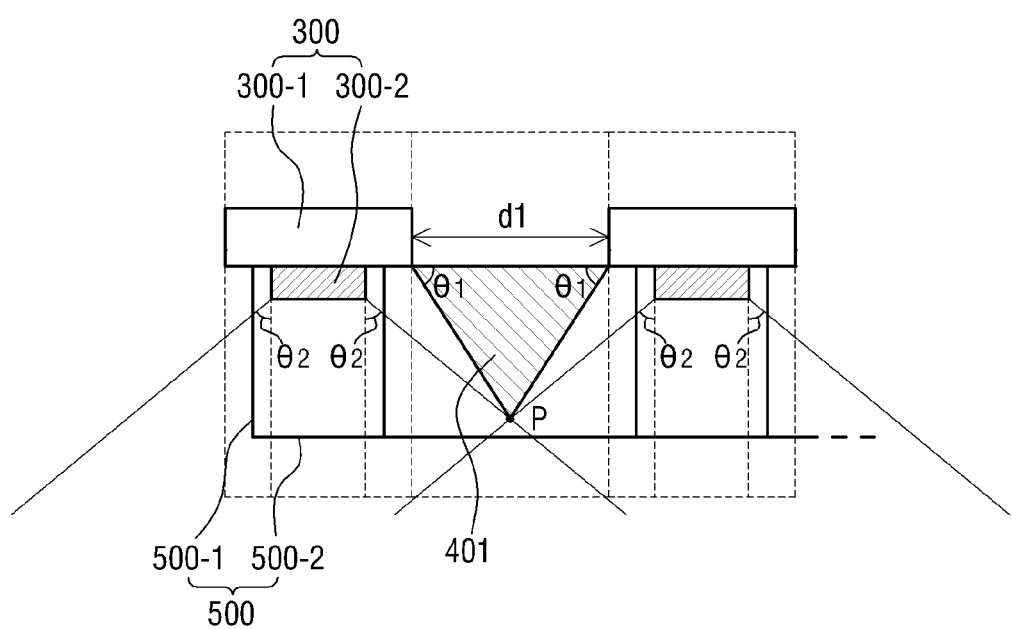
FIG. 9 is a partially enlarged view of the backlight unit shown in FIG. 7.

FIG. 7 is a partial, plan view of a backlight unit according to another embodiment of the present system and method, FIG. 8 is a cross-sectional view of the backlight unit shown in FIG. 7, and FIG. 9 is a partially enlarged view of the backlight unit shown in FIG. 7.

Referring to FIG. 7, the backlight unit shown differs from the backlight unit of FIG. 3 in that the dummy wiring patterns 401 have a triangular shape. A width of the dummy wiring pattern 401 may decrease gradually in increasing distance from a light source unit 300 to the light guide plate 100. That is to say, the base of the dummy wiring pattern 401 may be adjacent to the light source unit 300, and the vertex P of the dummy wiring pattern 401 may be adjacent to the light guide plate 100. In an exemplary embodiment, the planar shape of the dummy wiring pattern 401 may be that of an isosceles triangle having a width constantly decreasing away from the light source unit 300.

Referring to FIG. 8, an adhesive layer 700 may overlap with the dummy wiring pattern 401 such that their edges are aligned. In other words, the adhesive layer 700 may have the same triangular shape and size as the dummy wiring pattern 401 and may overlap completely with the dummy wiring pattern 401, but aspects of the present system and method are not limited thereto. The adhesive layer 700 may be smaller than the dummy wiring pattern 401 in size. That is to say, in another exemplary embodiment, the adhesive layer 700 may have a planar shape similar to that of the dummy wiring pattern 401 and may overlap with the dummy wiring pattern 401.

In this case, as described above, the wiring patterns 500 may be spaced a distance apart from a bottom surface of the light guide plate 100.

Hereinafter, a specific shape of the dummy wiring pattern 401 is described with reference to FIG. 9. For the sake of convenient explanation, a width of the base of the dummy wiring pattern 401 is referred to as a first distance dl, a base angle of the dummy wiring pattern 401 is referred to as a first angle θ1, and a maximum radiation angle of light beams emitted from the light emitting part 300-2 is referred to as a second angle θ2.

In an exemplary embodiment, the first distance dl may be substantially equal to or smaller than a distance between two adjacent light source units.

In an exemplary embodiment, opposite ends of the base of the dummy wiring pattern 401 may be in contact with the light source unit 300, but aspects of the present system and method are not limited thereto. In another exemplary embodiment, the opposite ends of the base of the dummy wiring pattern 401 may be spaced a distance apart from the light source unit 300.

In an exemplary embodiment, the first angle θ1 may be determined based on the second angle θ2. That is to say, when the second angle θ2 value is known or otherwise obtained, the first angle θ1 value may be calculated such that the outermost one among the plurality of light beams emitted from the light emitting parts 300-2 passes the vertex P of the dummy wiring pattern 401. Vice versa, if the first angle θ1 is known or otherwise obtained, the second angle θ2 value may be calculated such that the outermost one among the plurality of light beams emitted from the light emitting parts 300-2 passes the vertex P of the dummy wiring pattern 401. In this way, the light beams emitted from the light emitting parts 300-2 are not be affected by the dummy wiring patterns 400 because the light beams do not make contact (or very little, if any) with the dummy wiring patterns 401.

If the light beams emitted from the light emitting parts 300-2 come into contact with the dummy wiring patterns 401, the light beams may be scattered or reflected by the dummy wiring patterns 401 and result in light leakage. If, however, the dummy wiring patterns 401 are shaped and sized such that the light beams emitted from the light emitting parts 300-2 do not come into contact with the dummy wiring patterns 401, occurrence of the light leakage can be suppressed. That is to say, by adjusting the base angle θ1 of the dummy wiring patterns 401 based on the second angle θ2, light leakage can be suppressed.

Figure 10:
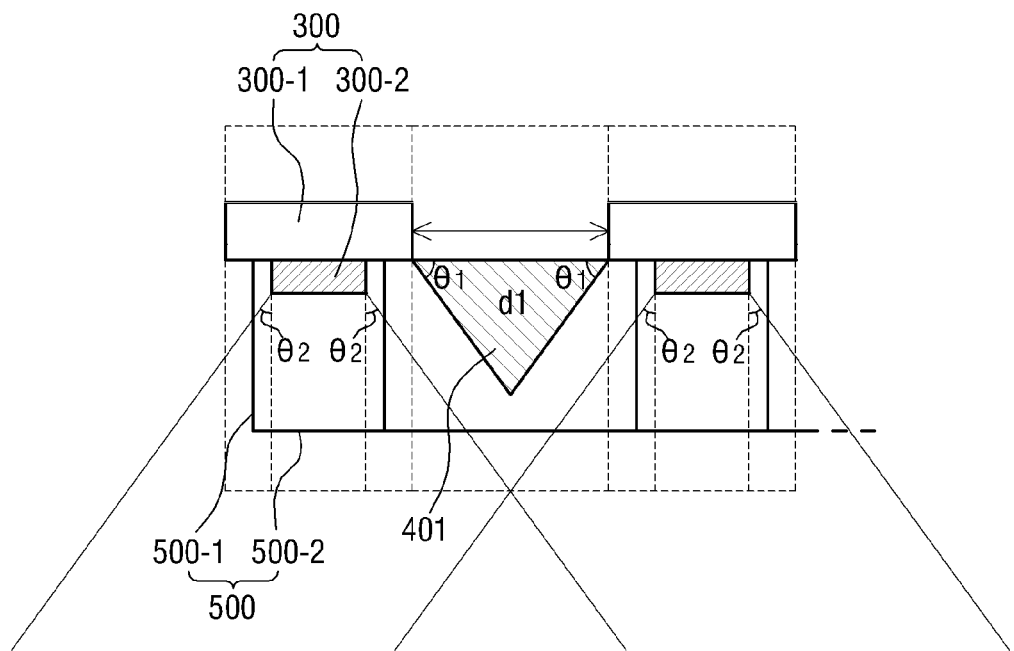
FIG. 10 is a partially enlarged view of a backlight unit according to another embodiment.

FIG. 10 is a partially enlarged view of a backlight unit according to another embodiment of the present system and method. The backlight unit shown in FIG. 10 differs from the backlight unit of FIG. 9 in that the outermost one among the plurality of light beams emitted from the light emitting part 300-2 travels in parallel or substantially in parallel with one of both sides of the dummy wiring pattern 401. That is to say, in this case, the second angle θ2 is equal to a value obtained by subtracting the first angle θ1 from 90°. Because the outermost light beams emitted from the light emitting parts 300-2 travel in parallel to the corresponding sides of the dummy wiring pattern 401, the emitted light beams do not come into contact with the dummy wiring pattern 401 and light leakage is suppressed.

Figure 11:
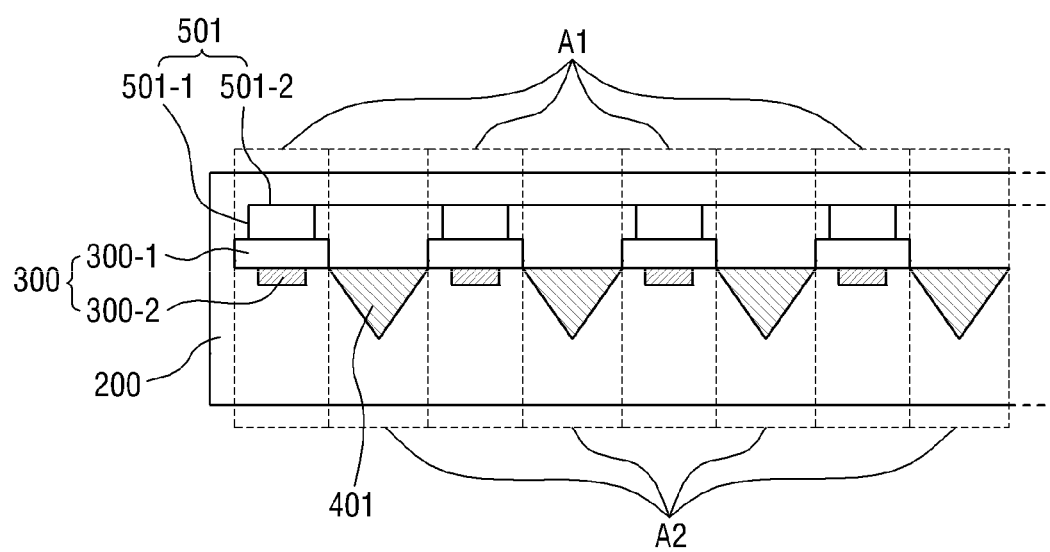
FIG. 11 is a plan view of a backlight unit according to another embodiment.

FIG. 11 is a plan view of a backlight unit according to another embodiment. The backlight unit shown in FIG. 11 differs from the backlight unit of FIG. 7 in that the wiring patterns 501 are positioned on the side of the light source units 300 (i.e., rear side) that is opposite to the side from which the light emitting parts 300-2 protrude (i.e., the front).

As described above, the wiring pattern 501 may include a first line wiring pattern 501-1 and a second line wiring pattern 501-2. The first line wiring pattern 501-1 may extend in parallel with the y-axis and make contact with the light source unit 300 at one end. The second line wiring pattern 501-2 may extend in parallel with the x-axis and make electrical contact with the first line wiring pattern 501-1 and a connector 600. That is to say, the first line wiring pattern 501-1 and the second line wiring pattern 501-2 may be electrically connected to each other and a bent portion may be formed at a contact point of the first line wiring pattern 500-1 and the second line wiring pattern 500-2.

FIG. 11 illustrates a case in which two first line wiring patterns 501-1 are connected to each light source unit 300 and one second line wiring pattern 501-2 is connected to first line wiring patterns 501-1 extending from a plurality of light source units 300. However, the present application contemplates any number and shape of the first line wiring pattern 501-1 and the second line wiring pattern 501-2 and not just those discussed herein. That is to say, one or more first line wiring pattern 501-1 may be connected to the light source units 300 and one or more second line wiring pattern 501-2 may connect the first line wiring patterns 501-1 to the connector 600, depending on the method used to electrically drive the light source units 300.

When the wiring pattern 501 is positioned in the rear of the light source unit 300, it does not overlap with the light guide plate 100 and, therefore, does not generate a step difference between the print circuit board 200 and the light guide plate 100. The absence of a step difference prevents adhesion performance between the light guide plate 100 and the printed circuit board 200 from being lowered.

Figure 12:
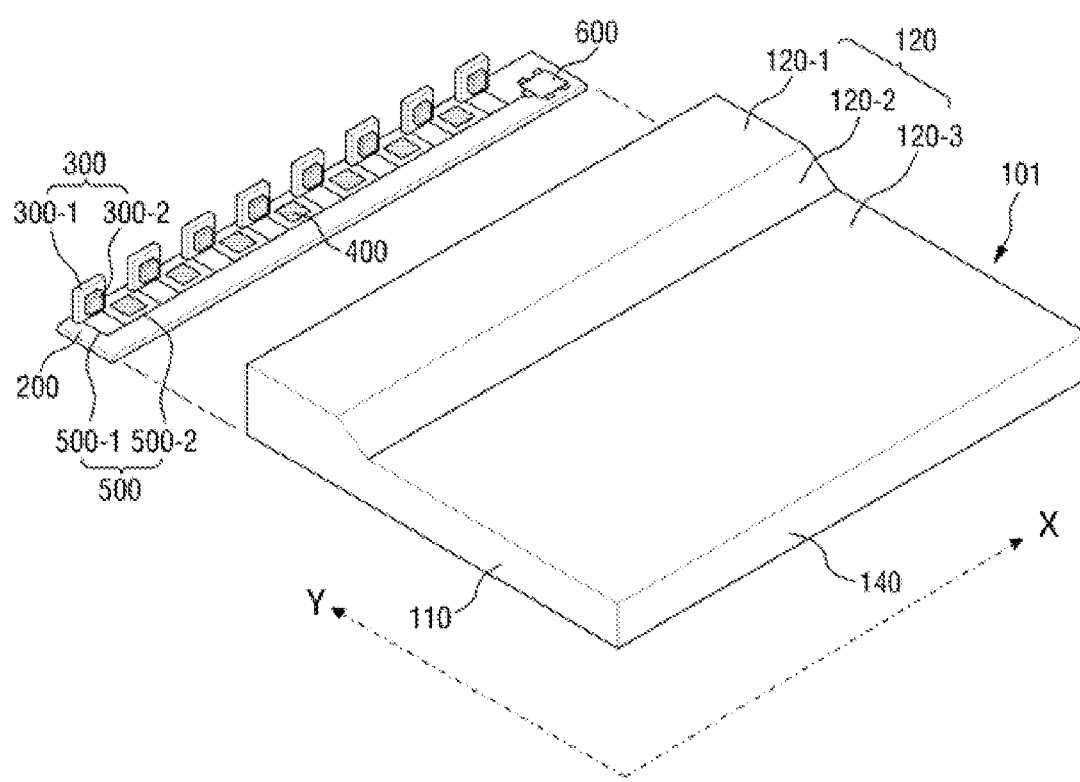
FIG. 12 is a perspective view of a backlight unit according to another embodiment.
Figure 13:
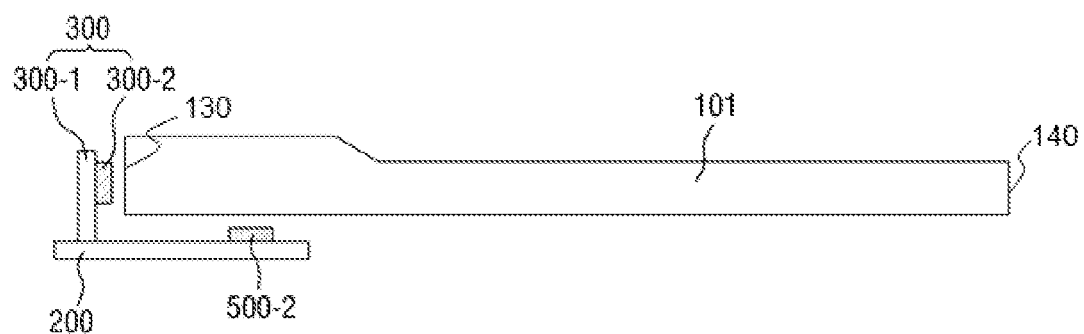
FIGS. 13 and 14 are cross-sectional views of the light guide plate shown in FIG. 12.
Figure 14:
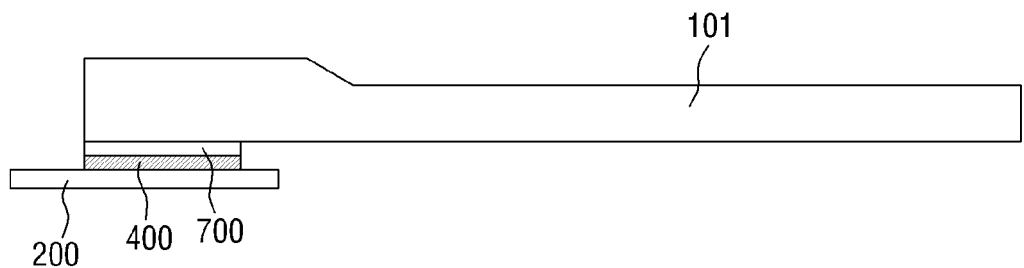

FIG. 12 is a perspective view of a backlight unit according to another embodiment. FIGS. 13 and 14 are cross-sectional views of the light guide plate 101 shown in FIG. 12.

Referring to FIGS. 12 to 14, the backlight unit differs from that shown in FIG. 1 in that a top surface 120 of a light guide plate 101 has a first planar surface 120-1, a declined surface 120-2 and a second planar surface 120-3.

A bottom surface 110 of the light guide plate 101 faces the top surface 120 of the light guide plate 101. A width (i.e., along the x-axis) of the bottom surface 110 of the light guide plate 101 may be substantially equal to the width of the top surface 120 of the light guide plate 101.

The bottom surface 110 of the light guide plate 101 may include a plurality of scattering patterns. The scattering patterns may be substantially the same as those already known in the art.

A light entrance surface 130 may be positioned on one side surface of the light guide plate 101 and a light exit surface 140 may be positioned on the opposite side surface of the light guide plate 101. In an exemplary embodiment, a height of the light entrance surface 130 may be different from a height of the light exit surface 140. That is to say, the height of the light entrance surface 130 may be greater than the height of the light exit surface 140, which may be due to a size of the light source unit 300 that irradiates light to the light guide plate 101. In other words, the height of the light entrance surface 130 may be made greater than the height of the light exit surface 140 so as to correspond to the size of the light source unit 300, thereby minimizing a loss in the light received by the light guide plane 101.

The first planar surface 120-1 may horizontally extend from the light entrance surface 130 positioned on one side surface of the light guide plate 101. In other words, the first planar surface 120-1 may horizontally extend from a top end of the light entrance surface 130 in a first direction, e.g., towards the light exit surface 140. In an exemplary embodiment, the first direction may be perpendicular to the light entrance surface 130.

The declined surface 120-2 may decline from the adjacent end of the first planar surface 120-1 at an angle. The second planar surface 120-3 may extend from the lower end of the declined surface 120-2 in the first direction. Specifically, the second planar surface 120-3 may extend from the lower end of the declined surface 120-2 to a top end of the light exit surface 140 facing the light entrance surface 130. That is to say, the extended end of the second planar surface 120-3 and the top end of the light exit surface 140 may contact each other.

In an exemplary embodiment, as FIG. 14 illustrates, an adhesive layer 700 may overlap with only the dummy wiring pattern 400. In this case, a region of the adhesive layer 700 overlapping with only the dummy wiring pattern 400 may come into contact with the bottom surface of the light guide plate 101. The other regions of the adhesive layer 700 that do not overlap with the dummy wiring pattern 400 may be spaced a distance apart from the bottom surface of the light guide plate 101. In addition, a top surface of the printed circuit board 200 and the wiring pattern 500 (not shown in FIG. 14), on which the adhesive layer 700 is not disposed, may be spaced a distance apart from the bottom surface of the light guide plate 101.

In an exemplary embodiment, the adhesive layer 700 may be disposed outside a boundary between the first planar surface 120-1 and the declined surface 120-2. That is to say, the adhesive layer 700 may overlap with the first planar surface 120-1 and not overlap with the declined surface 120-2.

Figure 15:
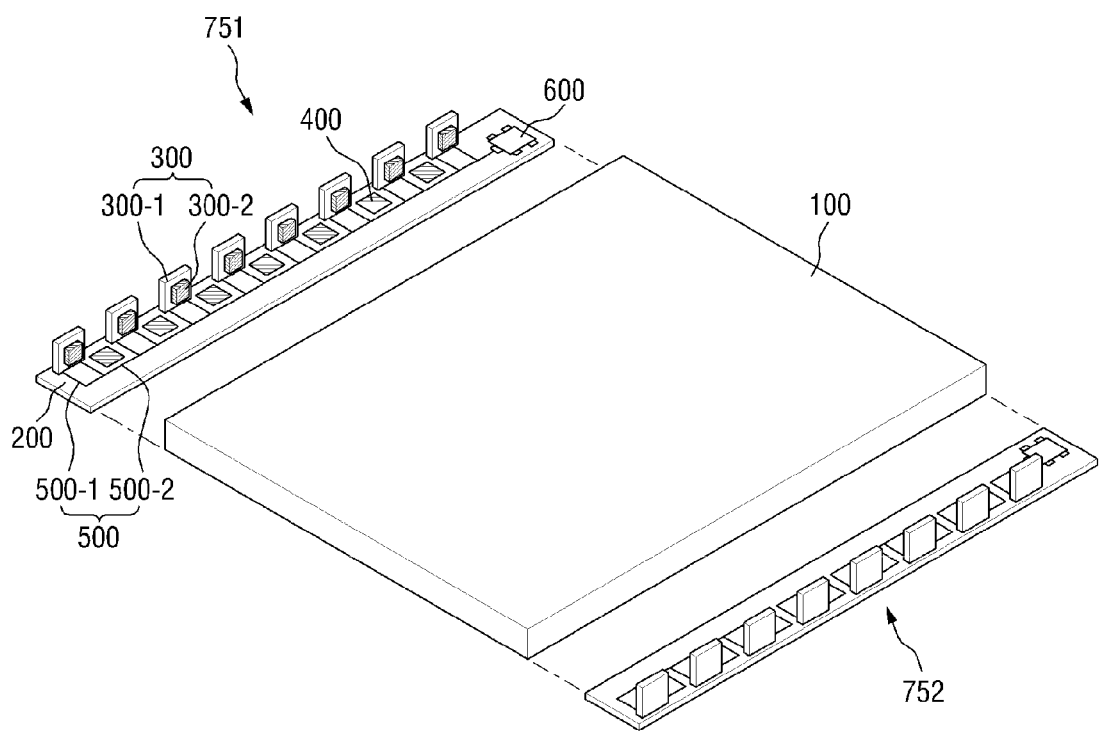
FIG. 15 is a perspective view of the backlight unit according to another embodiment.

FIG. 15 is a perspective view of a backlight unit according to another embodiment. Referring to FIG. 15, the backlight unit differs from that shown in FIG. 1 in that two light emitting packages—751 and 752—are disposed at opposite sides of a light guide plate 100 and face each other. In an exemplary embodiment, the first light emitting package 751 and the second light emitting package 752 may be substantially the same as the aforementioned light emitting package 750.

Figure 16:
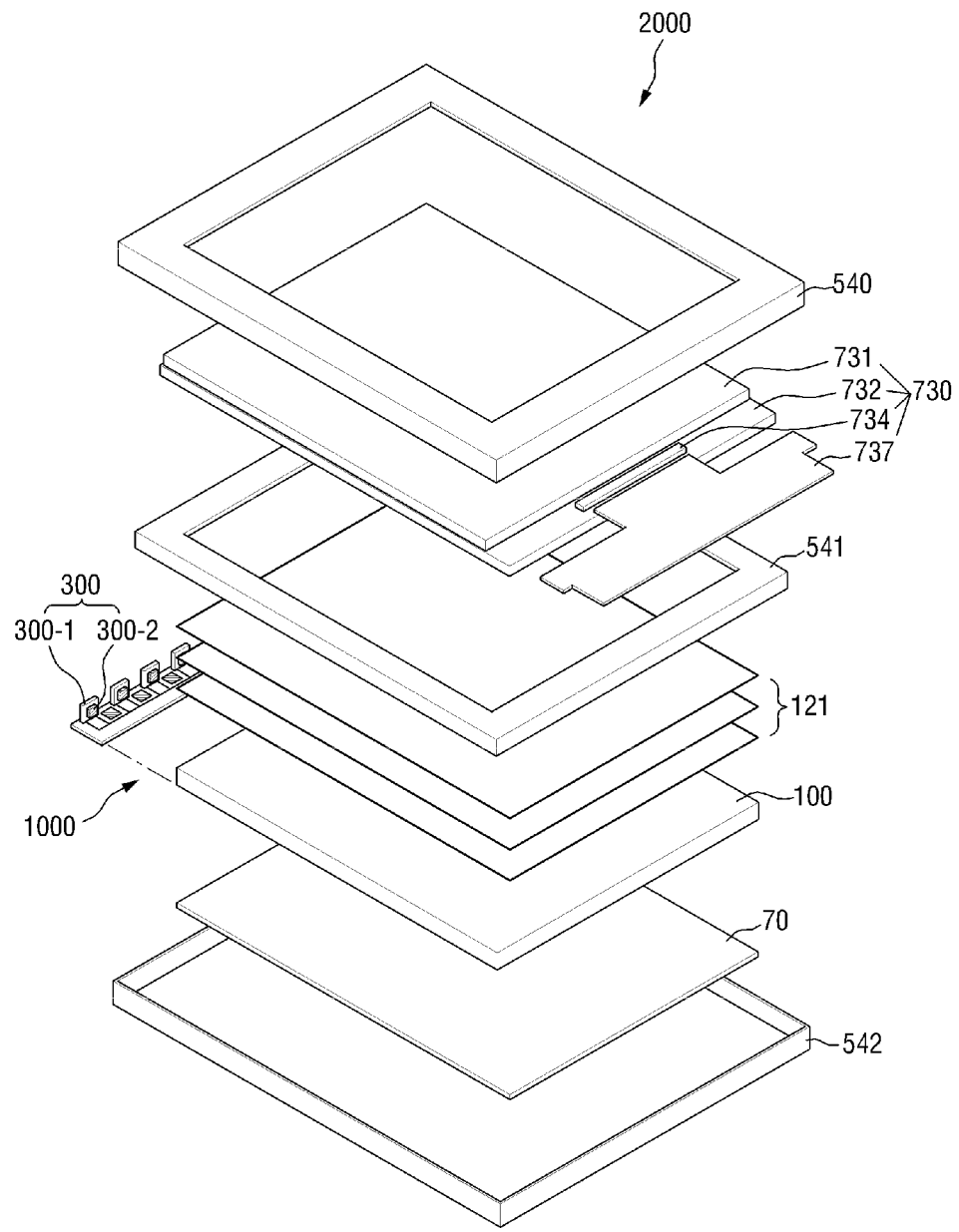
FIG. 16 is a perspective view of an LCD according to an embodiment.

FIG. 16 is a perspective view of an LCD according to an embodiment of the present system and method. Referring to FIG. 16, the LCD includes a backlight unit 1000. Here, the backlight unit 1000 includes a light emitting package and a light guide plate 100 disposed at one side of the light emitting package. The light emitting package includes a printed circuit board that has first regions that are spaced an interval apart from each other and second regions defined between the first regions. The light emitting package also has light source units 300 disposed on the first regions of the printed circuit board, dummy wiring patterns disposed on the second regions of the printed circuit board, and wiring patterns disposed on the printed circuit board and electrically connected to the light source units 300. The backlight unit may be substantially the same as the backlight units discussed above in connection with the various embodiments of the present system and method.

As shown in FIG. 16, the LCD 2000 may further include a display panel 730, a top chassis 540, a mold frame 541, optical sheets 121, a reflective sheet 70, and a bottom chassis 542. The display panel 730 includes a display area and a non-display area. In addition, the display panel 730 may include a first substrate 731, a second substrate 732 facing the first substrate 731, a liquid crystal layer, and a driver 734 and a flexible circuit board 737 that are attached to the first substrate 731.

The display area of the display panel 730 refers to an area on which an image is displayed. Conversely, the non-display area of the display panel 730 refers to an area on which an image is not displayed. On a plan view of the display panel 730, the display area generally refers to a central portion of an overlapping area of the first substrate 731 and the second substrate 732. The non-display area generally refers to a peripheral portion of the overlapping area of the first substrate 731 and the second substrate 732. The display area may be an area where the display panel 730 and the top chassis 540 do not overlap with each other. The non-display area may be an area where the display panel 730 and the top chassis 540 overlap with each other. In addition, on the plan view of the display panel 730, a shape of the display area may be similar to that of the second substrate 732, while an internal area of the display area may be smaller than that of the second substrate 732. In addition, on the plan view of the display panel 730, boundary lines of the display area and the non-display area may be parallel with sides of the second substrate 732 facing the display area and the non-display area. A shape formed by the boundary lines of the display area and the non-display area may be rectangular.

At least a portion of the first substrate 731 may overlap with the second substrate 732. The central portion of the overlapping area of the first substrate 731 and the second substrate 732 may be a display area, and the peripheral portion of the overlapping area of the first substrate 731 and the second substrate 732 may be a non-display area. The driver 734 and the flexible circuit board 737 may be attached to a non-overlapping area of the first substrate 731 and the second substrate 732.

The second substrate 732 may be disposed to face the first substrate 731. A liquid crystal layer may be interposed between the first substrate 731 and the second substrate 732. A sealing member, such as a sealant, may be used to combine the first substrate 731 and the second substrate 732 with each other and seal the same. For example, the sealing member may be provided between the first substrate 731 and the second substrate 732 along their edges.

The first substrate 731 and the second substrate 732 may each have the shape of a rectangular parallelepiped, but aspects of the present system and method are not limited thereto. The first substrate 731 and the second substrate 732 may have various shapes according to the shape of the display panel 730.

The driver 734 may provide various kinds of signals, including driving signals, for displaying an image on the display area. The flexible circuit board 737 may output various signals to the driver 734.

As FIG. 16 illustrates, the backlight unit 1000 may be disposed below the bottom surface of the display panel 730. The backlight unit 1000 may include light source units 300 that emit light, and a light guide plate 100 that guides the light emitted from the light source units 300. A reflective sheet 70 disposed beneath the light guide plate 100 changes the path of light that travel to the bottom surface of the light guide plate 100. One or more optical sheets 121 disposed above the light guide plate 100 modulate the optical characteristics of the light being guided by the light guide plate 100. A mold frame 541 situated above the optical sheets 121 accommodates the optical sheets 121.

Here, the mold frame 541 may support and secure the display panel 730 by making contact with the edge of the bottom surface of the display panel 730. In an exemplary embodiment, the edge of the bottom surface of the display panel 730 may be the non-display area of the display panel 730. That is to say, at least a portion of the mold frame 541 may overlap with the non-display area of the display panel 730.

The top chassis 540 may cover the edge of the display panel 730 and may surround the side surfaces of the display panel 730 and the light source units 300. The bottom chassis 542 may receive the optical sheet 121, the light guide plate 100, the backlight unit 1000, and the reflective sheet 70. The top chassis 540 and the bottom chassis 542 may be made of a conductive material, e.g., a metal.

While the present system and method has been particularly shown and described with reference to exemplary embodiments thereof, those of ordinary skill in the art would understand that that various changes in form and details may be made therein without departing from the spirit and scope of the present system and method. It is therefore desired that the present embodiments be considered in all respects as illustrative and not restrictive of the scope of the claimed subject matter.

What is claimed is:

1. A backlight unit comprising:
a light emitting package; and
a light guide plate disposed at one side of the light emitting package,
wherein the light emitting package comprises:
a printed circuit board including first regions disposed to be spaced an interval apart from each other and second regions defined between the first regions;
light source units disposed on the first regions of the printed circuit board;
dummy wiring patterns disposed on the second regions of the printed circuit board; and
wiring patterns disposed on the printed circuit board and electrically connected to the light source units.

2. The backlight unit of claim 1, wherein each of the wiring patterns includes
a first line wiring pattern that extends along a first axis and makes contact with a light source unit at a first end, and
a second line wiring pattern that extends along a second axis and makes contact with a second end of the first line wiring pattern.

3. The backlight unit of claim 1, wherein the dummy wiring patterns and the wiring patterns protrude from the printed circuit board in equal distance.

4. The backlight unit of claim 1, wherein the dummy wiring patterns and the wiring patterns are formed using the same material.

5. The backlight unit of claim 1, wherein the dummy wiring patterns and the wiring patterns are electrically insulated from each other.

6. The backlight unit of claim 1, wherein each of the dummy wiring patterns is shaped of a triangle.

7. The backlight unit of claim 1, wherein an adhesive layer is interposed between a bottom surface of the light guide plate and a top surface of the printed circuit board.

8. The backlight unit of claim 7, wherein the adhesive layer overlaps with the dummy wiring patterns at one or more regions.

9. The backlight unit of claim 7, wherein the adhesive layer has the same shape and size as each of the dummy wiring patterns and overlaps completely with the dummy wiring patterns.

10. The backlight unit of claim 8, wherein the one or more regions of the adhesive layer that overlap with the dummy wiring patterns are in contact with the light guide plate, and other regions of the adhesive layer that do not overlap with the dummy wiring patterns are spaced a distance apart from the light guide plate.

11. The backlight unit of claim 1, wherein each of the light source units includes a body part that protrudes vertically from the printed circuit board and a light emitting part that protrudes from a sidewall of the body part.

12. The backlight unit of claim 6, wherein each dummy wiring pattern is disposed such that an outermost one among a plurality of light beams emitted from an adjacent light source unit passes one vertex of each of the dummy wiring patterns.

13. The backlight unit of claim 6, wherein each dummy wiring pattern is disposed such that an outermost one among a plurality of light beams emitted from an adjacent light source unit travels in parallel with one side of each of the dummy wiring patterns.

14. A liquid crystal display comprising:
a backlight unit; and
a display panel disposed on the backlight unit,
wherein the backlight unit includes a light emitting package, and a light guide plate disposed at one side of the light emitting package, the light emitting package comprising a printed circuit board including first regions that are spaced an interval apart from each other and second regions defined between the first regions; light source units disposed on the first regions of the printed circuit board; dummy wiring patterns disposed on the second regions of the printed circuit board; and wiring patterns disposed on the printed circuit board and electrically connected to the light source units.

15. The liquid crystal display of claim 14, wherein an adhesive layer is interposed between a bottom surface of the light guide plate and a top surface of the printed circuit board.

16. The liquid crystal display of claim 15, wherein the adhesive layer overlaps with the dummy wiring patterns at one or more regions.

17. The liquid crystal display of claim 16, wherein the one or more regions of the adhesive layer that overlap with the dummy wiring patterns are in contact with the light guide plate, and other regions of the adhesive layer that do not overlap with the dummy wiring patterns are spaced a distance apart from the light guide plate.

18. The liquid crystal display of claim 14, wherein each of the light source units includes a body part that protrudes vertically from the printed circuit board and a light emitting part that protrudes from a sidewall of the body part.

19. The liquid crystal display of claim 14, wherein each of the dummy wiring patterns is shaped of a triangle, wherein each dummy wiring pattern is disposed such that an outermost one among a plurality of light beams emitted from an adjacent light source unit passes one vertex of each of the dummy wiring patterns.

20. The liquid crystal display of claim 14, wherein each of the dummy wiring patterns is shaped of a triangle, wherein each dummy wiring pattern is disposed such that an outermost one among a plurality of light beams emitted from an adjacent light source unit travels in parallel with one side of each of the dummy wiring patterns.

* * * * *